United States Patent
McGahay et al.

(10) Patent No.: US 6,271,595 B1
(45) Date of Patent: Aug. 7, 2001

(54) METHOD FOR IMPROVING ADHESION TO COPPER

(75) Inventors: Vincent J. McGahay, Poughkeepsie; Thomas H. Ivers, Wappingers Falls; Joyce C. Liu, Hopewell Junction, all of NY (US); Henry A. Nye, III, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/231,618

(22) Filed: Jan. 14, 1999

(51) Int. Cl.$^7$ .................. H01L 21/328; H01L 21/479
(52) U.S. Cl. ................... 257/762; 257/734; 257/767
(58) Field of Search .................... 257/762, 767, 257/734, 750, 741

(56) References Cited

U.S. PATENT DOCUMENTS

| | | | |
|---|---|---|---|
| 3,765,956 | 10/1973 | Li | 148/33 |
| 5,324,684 | 6/1994 | Kermani et al. | 437/95 |
| 5,391,517 | * 2/1995 | Gelatos et al. | |
| 5,447,887 | 9/1995 | Filipiak et al. | 437/200 |
| 5,489,550 | 2/1996 | Moslehi | 437/165 |
| 5,529,954 | 6/1996 | Iijima et al. | 437/189 |
| 5,633,047 | 5/1997 | Brady et al. | 427/437 |
| 5,855,993 | 1/1999 | Brady et al. | |

FOREIGN PATENT DOCUMENTS 0 472 804 A2   4/1992  (EP) .

OTHER PUBLICATIONS

Chemical Vapor Deposition of $Cu_3Ge$ for High Aspect Ratio Metallization, *IBM Technical Disclosure Bulletin 35*, No. 4B, Sep. 1992.

Aboelfotoh et al, Copper Passivation of Boron in Silicon and Boron Reactivation Kinetics, *Physical Review B 44*, No. 23, Dec. 15, 1991.

Liou et al, Oxidation of Cu and $Cu_3Ge$ Thin Films, *J. Appl. Phys. 77*, No. 10, May 1995.

* cited by examiner

*Primary Examiner*—Kevin M. Picardat
*Assistant Examiner*—D. M. Collins
(74) *Attorney, Agent, or Firm*—Connolly, Bove, Lodge & Hutz, LLP.; Joseph P. Abate, Esquire

(57) ABSTRACT

Poorly adherent layers such as silicon nitride and silicon dioxide exhibit improved adhesion to copper member by providing an intervening germanium-containing layer. The germanium-containing layer is copper germanide, germanium oxide, germanium bitride or combinations thereof. The germanium-containing layer enhances the adhesion such that the poorly adherent layer is less susceptible to delamination from the copper member.

15 Claims, 1 Drawing Sheet

METHOD FOR IMPROVING ADHESION TO COPPER

DESCRIPTION

1. Technical Field

The present invention is directed to using copper or copper alloys in semiconductor devices, and is especially directed to improving the adhesion of another layer to the copper or copper alloy.

2. Background of Invention

Interest in using copper as interconnects in semiconductor devices continues to increase since it possesses a lower resistivity and a reduced susceptibility to electromigration failure as compared to the more traditional aluminum or aluminum alloy interconnects.

However, since copper has a tendency when used in interconnect metallurgy to diffuse into surrounding dielectric materials such as silicon dioxide, capping of the copper is essential. The capping inhibits this diffusion. One widely suggested method of capping includes employing a conductive barrier layer along the sidewalls and bottom surface of a copper interconnect. Typical of such barrier layers is tantalum or titanium. Capping of the upper surface of a copper interconnect usually employs silicon nitride.

However, silicon nitride does not exhibit strong adhesion to copper surfaces. Accordingly, the silicon nitride-to-copper interface is extremely susceptible to delamination, especially under conditions of mechanical loading. Examples of instances where mechanical loading can lead to delamination include chemical-mechanical polishing steps during wafer processing, chip pull such as used in substrate rework, and removal of chips after burn-in from a temporary attach substrate.

Delamination of silicon nitride from a copper surface creates a path for copper to diffuse outward and a path for moisture or other contaminants to diffuse inward. This creates reliability problems for the semiconductor device.

Moreover, various other materials such as silicon dioxide do not adhere well to copper surfaces.

It has been suggested to use a copper silicide film on copper interconnects to eliminate the silicon nitride-to-copper interface adhesion problems. Along these lines, see U.S. Pat. No. 5,447,887 to Filipiak et al. However, copper silicides exhibit a relatively high electrical resistivity and may cause an unacceptably large increase in resistance of copper interconnects. Moreover, copper silicides have been reported to be reactive with atmospheric oxygen and tend to suffer resistivity increases upon exposure to oxygen at room temperature. In addition, problems exist in forming the copper silicide which, in turn, leads to non-uniformity and non-repeatability of the procedure.

Accordingly, a need exists for improving adhesion of layers such as silicon nitride and silicon dioxide to copper surfaces without the concomitant disadvantages associated with using copper silicide.

SUMMARY OF THE INVENTION

The present invention relates to improving the adhesion between copper surfaces and surfaces that do not adhere well to the copper surfaces. In particular, the present invention relates to a semiconductor structure comprising a copper member located within a semiconductor device. A layer of copper germanide, germanium oxide, germanium nitride or combinations thereof is located on at least one surface of the copper member. A layer of a material that does not tenaciously adhere to copper is located on the layer of copper germanide, germanium oxide or germanium nitride. The germanium-containing layer improves the adhesion of the poorly adhering material to the copper member.

In addition, the present invention is concerned with a process for fabricating a semiconductor structure which comprises the steps of providing a layer of at least one germanium-containing material selected from the group consisting of copper germanide, germanium oxide, germanium nitride and combinations thereof onto at least one surface of a copper member; and then providing a layer of a material that does not adhere well to copper on the layer of the germanium-containing material. The present invention also relates to a semiconductor structure obtained by the above process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures which are schematic diagrams of examples of semiconductor structures in accordance with the present invention.

According to the present invention, the adhesion of poorly adherent materials to a copper surface is improved by including an intervening germanium-containing layer. The germanium-containing layer can be copper germanide, germanium oxide, germanium nitride, or combinations of these layers.

Figure 1:
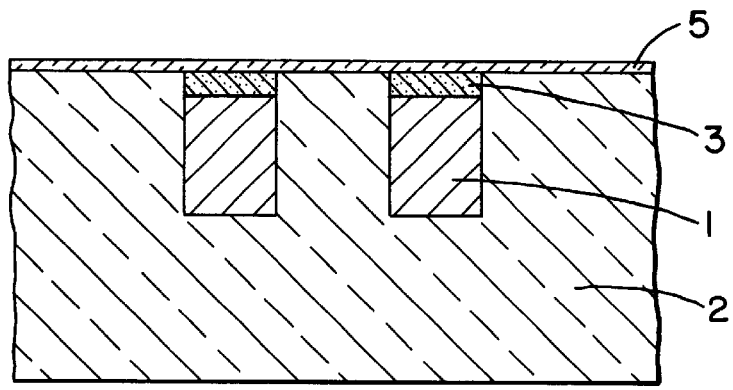
FIG. 1 is a schematic diagram of an example of a semiconductor structure in accordance with the present invention.

As illustrated in FIG. 1, copper wiring 1 is included on a semiconductor wafer (not shown) such as silicon, silicon-germanium alloys or gallium-arsenide. The copper wiring is electrically isolated by including an interlevel dielectric 2 such as silicon dioxide ($SiO_2$), phosphosilicate-glass (PSG), boron doped PSG (BPSG), or tetraethylorthosilicate (TEOS). In addition, the dielectric can include low dielectric constant materials such as fluorinated $SiO_2$, organic polymers and porous dielectrics and the capping structures sometimes employed for integration purposes. The copper wiring includes copper and copper alloys. In addition, the copper wiring can be capped along its bottom and sidewall surfaces with a conductive barrier (not shown) such as tantalum or titanium. The copper is typically about 1000 to about 20000 Å thick.

According to the present invention, a layer of a germanium-containing material is provided on the copper. The germanium-containing material includes copper germanide, germanium oxide, germanium nitride or combinations of these materials. According to preferred aspects of the present invention, a layer 3 of copper germanide is formed on the exposed copper surfaces by flowing germane (GeH$_4$) over the structure at elevated temperatures of about 200 to about 450° C. and preferably about 350 to about 400° C. The flow rate of the germane is typically about 15 to about 80 sccm and more typically about 2 to about 5 sccm. In addition, typically a mixture of germane and a non-active gas such as helium, argon or nitrogen is employed wherein the concentration of the germane is about 0.05 to about 5% and preferably about 0.1 to about 0.5%. A diluted gas mixture of the germane is employed in order to limit the amount of copper reacted with the germane. Typically, the thickness of the copper germanide formed from this reaction is about 100 to about 1000 Å and preferably about 150 to about 400 Å. In place of germane, other germanium-containing gases such as Ge$_2$H$_6$ can be used to selectively form copper germanide. For instance, see U.S. Pat. No. 5,420,069. Also, other methods of providing a copper germanide layer on the copper can be used such as chemical vapor deposition of copper germanide. However, such a process is not preferred since it would then require a masking and etching step in order to provide the copper germanide layer only on the exposed surfaces of the copper. On the other hands employing the reaction with the germane gas, the germanide is selectively formed only on those surfaces where exposed copper exists.

The germanide forms in a relatively uniform and reproducible manner, especially when compared to forming copper silicide. Furthermore, the resistivity of copper germanide is relatively low as compared to that of the copper silicide. In particular, the resistivity of copper germanide is about 5.5 μohm cm at room temperature whereas that for copper silicide is about 55 μohm cm. Copper, on the other hand, has a resistivity of about 2.2 μohm cm or lower.

Next, if desired, a layer of a poorly adherent material such as silicon nitride or silicon dioxide can be deposited on the copper germanide layer 3. In the case of silicon nitride, it can be deposited by a well known plasma enhanced chemical vapor deposition process (PECVD). Such process involves introducing a silicon-bearing gas species such as silane and a nitrogen-bearing gas species such as ammonia and/or nitrogen in the presence of a plasma. Other silicon-bearing gas species include disilane, dichlorosilane and tetraethylorthosilicate. Other nitrogen-containing gas species include hexamethyldisilazane. The deposition of the silicon nitride is usually carried out at temperatures of about 300 to about 450° C. and more typically at temperatures of about 350 to about 400° C. The layer 5 is typically about 100 to about 20000 Å thick, more typically for silicon nitride the layer is about 100 to about 1000 Å thick, and even more typically about 350 to about 700 Å thick for silicon.

Figure 2:
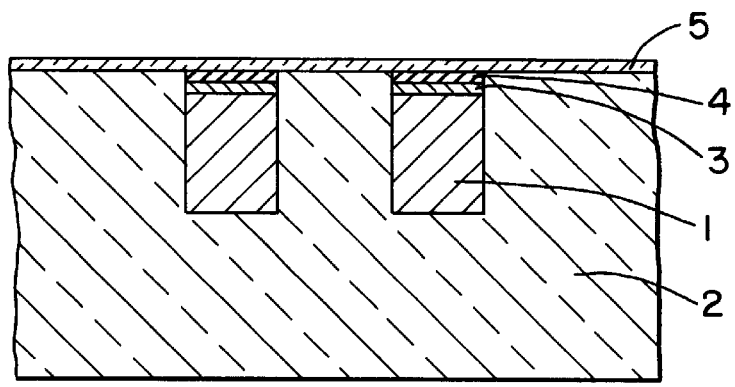
FIG. 2 is a schematic diagram of an example of another semiconductor structure in accordance with the present invention.
Figure 3:
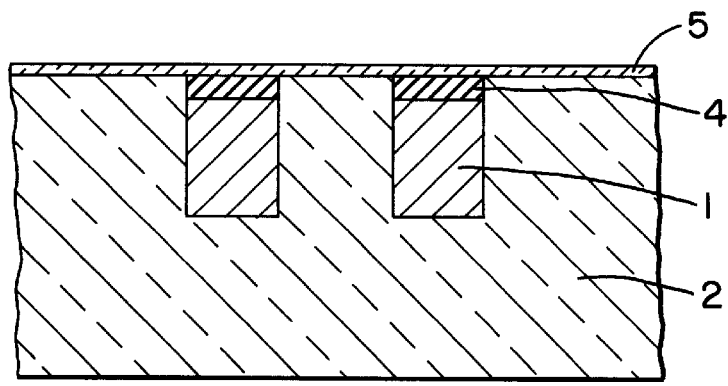
FIG. 3 is a schematic diagram of an example of a still further semiconductor structure in accordance with the present invention.

If desired, as illustrated in FIGS. 2 and 3, prior to depositing the layer 5, all or a portion of the copper germanide layer can be converted to germanium oxide and/or germanium nitride 4 to provide further oxidation barrier protecting the underlying copper. FIG. 2 illustrates concerning a portion of the copper germanide layer; whereas, FIG. 3 illustrates converting all of the copper germanide layer. The copper germanide can be oxidized by employing an oxygen-containing gas at temperatures of about 20 to about 400° C. Typically, the flow rate of the oxygen-containing gas would be about 5 to about 15 slm and the duration of the process would be about 5 sec to several days. During the oxidation process, the copper from the copper germanide will be expelled back into the underlying copper member. The copper germanide can be converted to germanium nitride by reaction with a nitrogen-containing gas or plasma such as ammonia or nitrogen at elevated temperatures of about 300 to about 750° C.

The germanium oxide formed by an airbreak (room temperature exposure to air) between copper germanide formation and nitride deposition has been found to lead to a substantial decrease in nitride to copper delamination and using stud pull tests. An in situ nitride cap deposition after germanide formation without an airbreak leads to improvement in an edge delamination test but not in the stud pull test. Edge delamination testing is described in Shaffer et al, Edge Delamination Tegting: A Method for Measuring the Adhesion of Thin-Film Coatings in Microelectronic Applications, Part 1: Numerical Analysis and Preliminary Results, in *Thin Films: Stresses and Mechanical Properties IV*, Materials Research Society Symposium Proceedings, Vol. 308, 1993, published by Materials Research Society, Pittsburgh, Pa., USA, pp. 535–539. Reference to the materials considered poorly adherent to copper or do not adhere well to copper refers to those materials that delaminate in the Edge delamination test at temperatures above the temperature at which silicon fails in this test.

Procedures for forming germanium nitride can be found in the *Gmelins Handbuch der anorganishen Chemie.* 8th Edition, Vol. 45, p. 34 (Verlag Chernie, Stuttgart, 1961). For example, exposure of germanium oxide to NH$_3$ at temperatures from 700 to 750° C. results in the formation of Ge$_3$N$_4$.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A semiconductor structure comprising a copper member located within a semiconductor device; a germanium-containing layer of at least one member selected from the group consisting of copper germanide, germanium oxide, germanium nitride and combinations thereof, located on at least one surface of the copper member; and a layer of a material poorly adherent to copper located on the germanium-containing layer.

2. The semiconductor structure of claim 1 wherein the copper member is copper or a copper alloy.

3. The semiconductor structure of claim 1 wherein the germanium-containing layer comprises copper germanide.

4. The semiconductor structure of claim 1 wherein the germanium-containing layer comprises germanium oxide.

5. The semiconductor structure of claim 1 wherein the germanium-containing layer comprises germanium nitride.

6. The semiconductor structure of claim 1 wherein the germanium-containing layer comprises a layer of copper germanide and a layer of germanium oxide.

7. The semiconductor structure of claim 1 wherein the germanium-containing layer contains a layer of copper germanide and a layer of germanium nitride.

8. The semiconductor structure of claim 1 wherein the germanium-containing layer contains a layer of copper germanide, a layer of germanium oxide and a layer of germanium nitride.

9. The semiconductor structure of claim 1 wherein the germanium-containing layer has a thickness of about 100 to about 1000 Å.

10. The semiconductor structure of claim 1 wherein the germanium-containing layer has a thickness of about 150 to about 400 Å.

11. The semiconductor structure of claim 9 wherein the copper has thickness of about 1000 to about 20,000 Å.

12. The semiconductor structure of claim 9 wherein the layer of material poorly adherent to copper has a thickness of about 100 to about 20000 Å.

13. The semiconductor structure of claim 1 wherein the material poorly adherent to copper is silicon nitride.

14. The semiconductor structure of claim 1 wherein the material poorly adherent to copper is silicon dioxide.

15. The semiconductor structure of claim 1, wherein the germanium-containing layer is located on top of the copper member and the layer of the material poorly adherent to copper is located on top of the germanium-containing layer.

* * * * *

UNITED STATES PATENT AND TRADEMARK OFFICE
CERTIFICATE OF CORRECTION

PATENT NO. : 6,271,595 B1
DATED : August 7, 2001
INVENTOR(S) : McGahay et al.

It is certified that error appears in the above-identified patent and that said Letters Patent is hereby corrected as shown below:

<u>Title page,</u>
ABSTRACT, line 5, change "bitride" to -- nitride --.

Signed and Sealed this

Twelfth Day of March, 2002

Attest:

JAMES E. ROGAN
*Attesting Officer*        *Director of the United States Patent and Trademark Office*